INVENTORS
HOLLIS L. CASWELL
LAWRENCE V. GREGOR
HANSEL L. MCGEE
BY S. P. Tedesco
ATTORNEY July 9, 1968 H. L. CASWELL ETAL 3,392,051

METHOD FOR FORMING THIN FILM ELECTRICAL CIRCUIT ELEMENTS BY PREFERENTIAL NUCLEATION TECHNIQUES

Filed June 8, 1964 2 Sheets-Sheet 2

United States Patent Office 3,392,051
Patented July 9, 1968

3,392,051

METHOD FOR FORMING THIN FILM ELECTRICAL CIRCUIT ELEMENTS BY PREFERENTIAL NUCLEATION TECHNIQUES

Hollis L. Caswell, Mount Kisco, and Lawrence V. Gregor, Crompond, N.Y., and Hansel L. McGee, Washington, D.C., assignors to International Business Machines Corporation, New York, N.Y., a corporation of New York
Filed June 8, 1964, Ser. No. 373,346
25 Claims. (Cl. 117—212)

ABSTRACT OF THE DISCLOSURE

Thin depositant films are vapor deposited in precise geometric patterns by polymerizing selected portions of a layer of polymerizable organic material by exposure to an energy medium, e.g. particle bombardment, actinic light, etc. Polymerized and unpolymerized portions of the organic layer exhibit different sticking coefficients with respect to a particular depositant. A controlled quantity of the depositant is deposited over the organic layer so as to form a continuous film only over polymerized portions thereof which exhibit the higher sticking coefficient. Polymerized portions of the organic layer serve a dual function in defining a nucleation image for the depositant and, also, providing electrical insulation between the depositant pattern and a previously formed depositant pattern.

This invention relates to thin film circuit elements, both active and passive, and, more particularly, to a method for forming thin film electrical circuit elements of micro miniature dimensions by vapor deposition techniques.

With the development of extremely large and complex electronic equipments and the attendant high cost of fabricating the same, considerable effort is being made by industry to develop new electrical circuit elements and, also, new techniques for fabricating and assembling the same. A large portion of this effort is directed to the development of batch fabrication techniques whereby a large plurality of electrical circuit elements as well as interconnections therebetween are concurrently formed in operative arrangement upon a single supporting substrate. The object of such efforts by industry is to simplify manufacturing techniques as well as to substantially reduce the cost of such electronic equipments.

Electrical circuit elements, both active and passive, contemplated in this effort are formed of thin conductive films arranged in superimposed fashion and appropriately insulated one from the other by a thin dielectric layer. For example, a recently developed circuit element is the "cryotron" which comprises thin film metallic gate and control conductors superimposed in magnetic field-applying relationship. A passive circuit element formed in similar fashion is a capacitor which comprises two thin metallic films separated by a dielectric film deposited in superimposed-registered relationship.

Generally, the constituent thin conductive and dielectric films forming these circuit elements and, also, the interconnections therebetween are formed by vacuum metallizing processes wherein particular materials are thermally evaporated in turn and deposited in precise geometric patterns onto a substrate. Prior art processes required the successive positioning and precise registration of numerous pattern-defining masks to define the individual depositant patterns. However, packing density of the circuit elements on the substrate is not optimum as the dimensions of such elements as well as the interconnections therebetween are necessarily limited by the dimensions of the defining apertures in such masks. In the present technology, aperture dimensions equal to or less than one-thousandth of an inch are very difficult to achieve. Also, during the deposition process, evaporant material adhering along the rim of the defining apertures vary their dimensions; accordingly, the pattern-defining masks must be frequently removed from the vacuum system and subjected to careful cleaning processes. Also, due to well-known shadowing effects, it is difficult to fabricate large circuit assemblies upon a large area substrate. These shadowing effects, due to an angular direction of the evaporant striking the substrate surface, cause uneven distribution and distortion of the depositant pattern. To insure high reliability and, also, to compensate for tolerances in the mask registration system, dielectric layers between superimposed conductive films are normally deposited of greater dimension than required so as to reduce the possibility of short-circuits therebetween which tend to further limit packing density.

Accordingly, the necessity of employing physical masking techniques in such processes, firstly, limits the definition of the resulting depositant layers due to shadowing effects; secondly, reduces the packing density of the electrical circuit elements; and, thirdly, complicates and prolongs the fabrication process. If physical masking techniques could be avoided in vacuum metallizing processes and alternate techniques developed to define the deposited conductive film patterns, batch fabrication of thin film circuit elements would be greatly simplified.

An object of this invention, therefore, is to provide a novel method for forming thin conductive films in selected geometric patterns by vacuum metallizing processes.

Another object of this invention is to provide a novel method for depositing thin conductive films in selected geometric patterns having better resolution than achieved by physical masking techniques.

Another object of this invention is to provide a method for forming multilayer circuit elements, both active and passive, by vacuum metallizing processes which do not include physical masking techniques.

Another object of this invention is to provide a novel method wherein a thin dielectric layer serves to define a nucleation image for a subsequently deposited thin conductive film as well as electrical insulation therefor.

Another object of this invention is to provide a method for forming electrical crossover connections on the surface of a planar substrate.

These and other objects and advantages of this invention are achieved by utilizing the particular properties of certain polymerizable organic materials to advantage. It has been observed that organic materials, which are also dielectrics, exhibit different sticking coefficients with respect to particular evaporants when treated (polymerized) to different degrees by an external energy medium. The resulting difference in sticking coefficients is such that a given quantity of metallic evaporant forms an electrically continuous film over the organic material in one state of polymerization and not in the other state of polymerization. Accordingly, when an organic thin film is selectively treated (polymerized) in pattern fashion, an electrically continuous film can be formed in a desired pattern. The amount of depositant should be sufficient to from an electrically continuous film only over those portions of the organic material exhibiting the high sticking coefficient with respect to the depositant materials. Treated areas of the organic material, in effect, form a positive nucleation image which serves a dual function in the fabrication process. Firstly, such image defines the depositant pattern by providing highly effective nucleation sites (i.e., high sticking coefficient and, secondly, such image provides electrical insulation between the pattern of metallic depositant and a previously deposited thin metallic film. It is to be particularly noted that the depositant pattern is formed without physical masking techniques whereby the resolution and, also, packing density of such patterns are substantially increased. Preferably, the thickness and, also, the treatment of the organic material are such as to completely polymerize those portions defining the nucleation image so as to provide electrical insulation between adjacent conductive films. A preferred thickness of the polymerized organic material approximately 500 A. insures a smooth surface and, also, a continuous insulating film. If desired, an additional thickness of organic material can be polymerized over the conductive film when formed.

In the recent art, organic thin films have been polymerized by both particle bombardment, i.e., electrons, ions, etc., or by photolytic processes. Electron beam polymerization of thin films of organic material has been described in "Polymerization of Butadiene Gas on Surfaces Under Low Energy Electron Bombardment," by I. Haller and P. White, Journal of Physical Chemistry, vol. 67, page 1784 and in "Formation of Thin Polymer Films by Electron Bombardment," by R. W. Christy, Journal of Applied Physics, vol. 31, No. 9, September 1960. Also, photolytic polymerization of organic thin films has been described in U.S. Patent No. 3,271,180 "Photolytic Processes for Fabricating Thin Film Patterns," issued on Sept. 6, 1966 to Peter White. In such processes, particle bombardment and, also, irradiation by actinic light elevate the molecules of an organic material to an excited energy state whereupon polymerization occurs. When particle bombardment techniques are employed, the polymerization process appears to be supported by a bond-rupturing mechanism due to the excessive energies of the bombarding particles. When photolytic techniques are employed, such process appears to be supported by a vinyl-addition polymerization mechanism. As hereinafter described, either technique can be employed in the practice of this invention.

The foregoing and other objects, features and advantages of the invention will be apparent from the following more particular description of preferred embodiments of the invention, as illustrated in the accompanying drawings.

Figures 1, 2A, 2B, 2C, 2D, 2E, 2F:
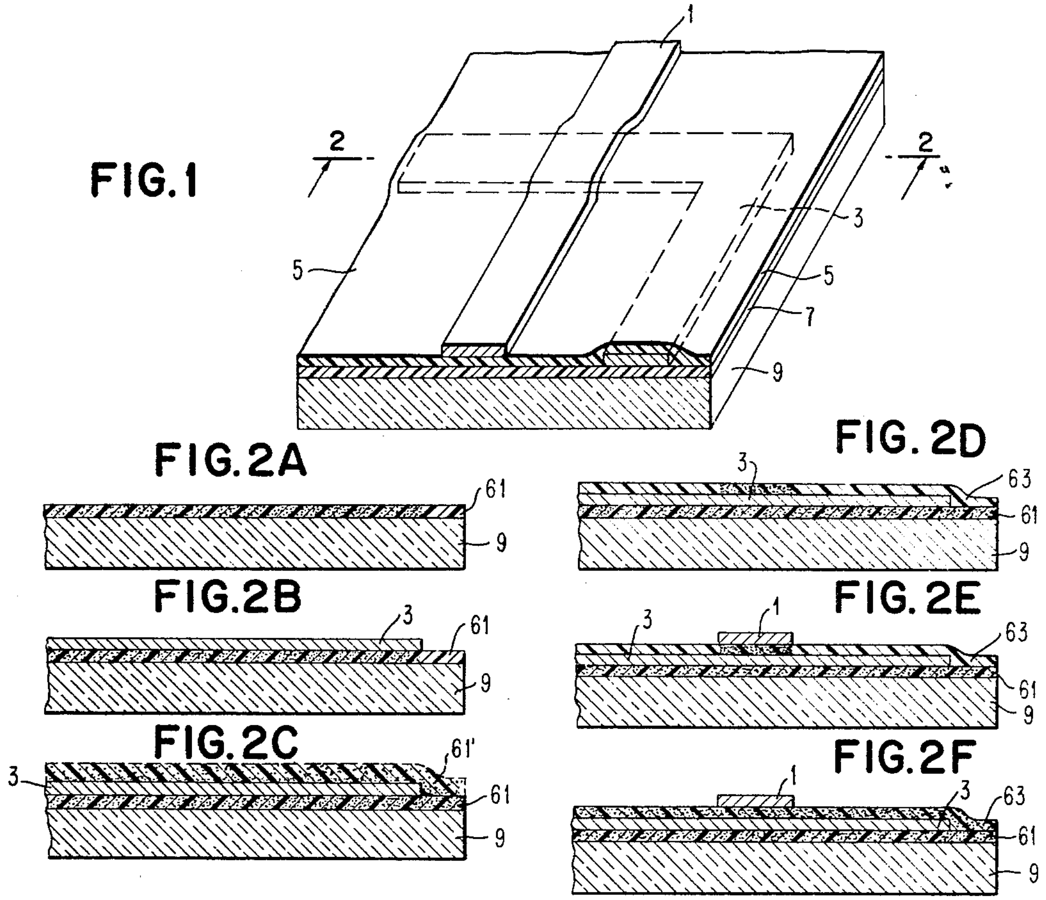
FIG. 1 is a cabinet view of superimposed thin metallic film patterns defining a crossover connection on a planar substrate and is symbolically representative of numerous electrical circuit elements, both active and passive, which can be formed in accordance with this invention.
FIGS. 2A through 2F is a cross-sectional view of the same laminate structure taken along the line 2—2 of FIG. 1 for describing the deposition sequence of the present invention.

Referring to FIG. 1, a laminate structure is shown which comprises superimposed thin metallic films 1 and 3 formed in desired patterns and insulated one from the other by a first thin dielectric layer 5 and from planar substrate 9 by a second thin dielectric layer 7. As illustrated, the laminate structure defines an electrical crossover connection useful, for example, to interconnect active circuit elements, not shown, formed on substrate 9. It will be evident to those skilled in the art that metallic films 1 and 3 can be deposited in accordance with the method hereinafter described in any desired pattern to form any of the well-known active and passive thin film circuit elements, e.g., cryotron, capacitor, etc. The laminate structure of FIG. 1 is symbolic of such devices in that the metallic films 1 and 3 are successively deposited in predetermined patterns and electrically insulated one from the other by a dielectric layer 5.

Heretofore, thin films 1 and 3 were formed in desired patterns by interposing pattern-defining masks over substrate 9 to intercept selected portions of an evaporant stream. To form the laminate structure of FIG. 1, for example, successive depositions of metallic films 1 and 3 and, also, dielectric layers 5 and 7 were required, each deposition necessitating the positioning and registration of a particular pattern-defining mask. The present method overcomes inherent disadvantages of prior art as the individual patterns of metallic films 1 and 3 are determined by the selective polymerization in pattern fashion of previously formed layers 5 and 7, respectively, of organic material. When polymerized in pattern fashion, the surface character of treated portions of layers 5 and 7 of organic material is sufficiently changed so as to define a nucleation image for subsequently-deposited metallic films 1 and 3, respectively. Such treated portions exhibit a sticking coefficient $\phi_1$ greater than the sticking coefficient $\phi_2$ of the untreated portions of layers 5 and 7 of organic material. Therefore, metallic depositant directed onto layers 5 and 7 of organic material tends to adhere and agglomerate more rapidly onto the treated portions defining the nucleation image (sticking coefficient $\phi_1$) and tends to re-evaporate from the untreated portions (sticking coefficient $\phi_2$). Accordingly, when the quantity of metallic depositant is controlled, an electrically continuous metallic film forms only over treated, or polymerized, portions of layers 5 and 7 exhibiting the higher sticking coefficient $\phi_1$, i.e., the nucleation image; also, the same portions of layers 5 and 7, since polymerized, serve to electrically insulate the resulting metallic thin film pattern.

The fabrication process is substantially simplified, therefore, in that the steps of defining the individual conductive thin film patterns 1 and 3 and providing electrical insulation therebetween are combined. The individual steps of the process are hereinafter more fully described in conjunction with FIG. 4 wherein a vacuum system for effecting the method of the invention by both electron beam and photolytic polymerization techniques is illustrated.

Figure 4:
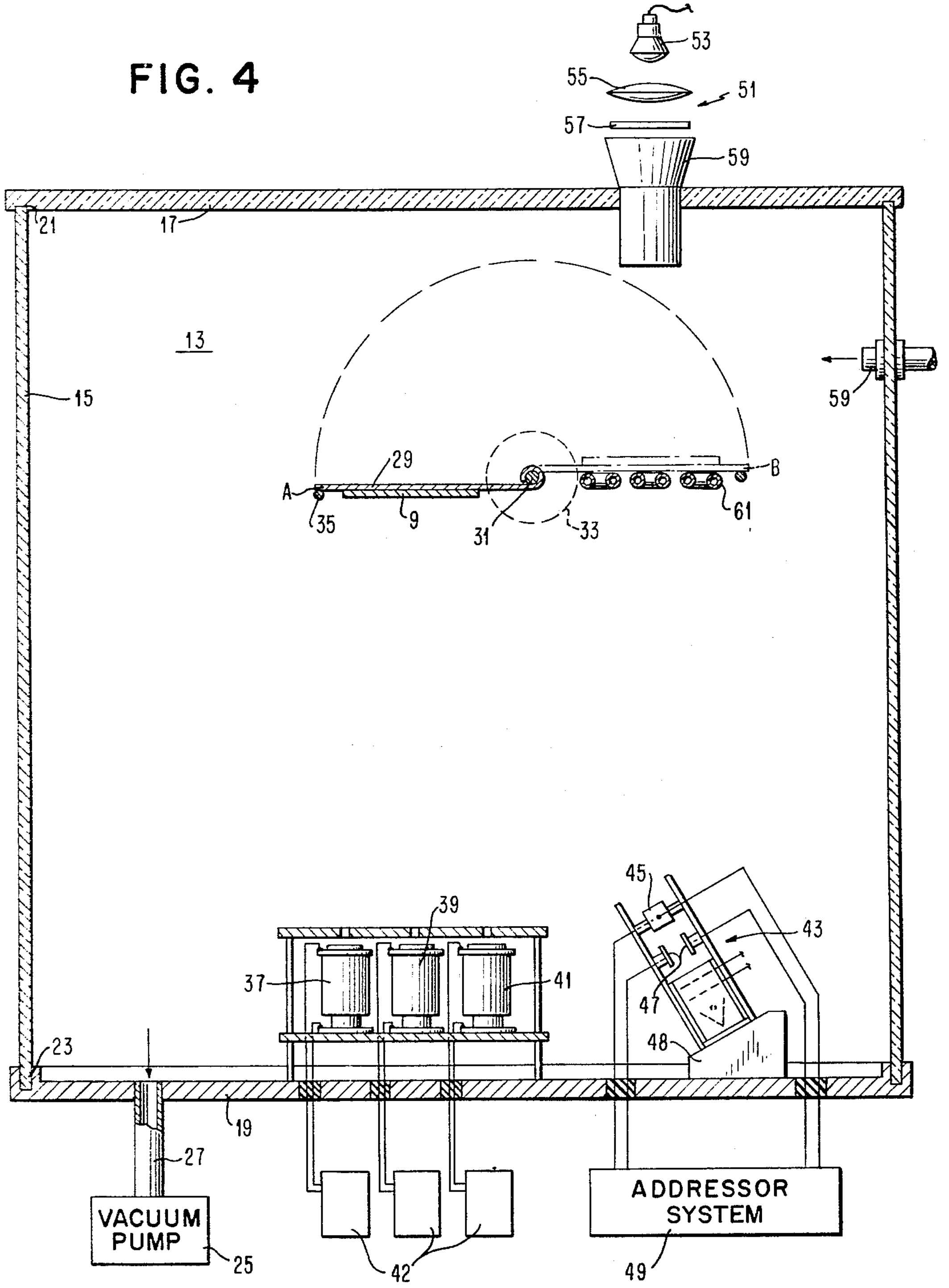
FIG. 4 illustrates a system suitable for the practice of the method of the invention.

The system of FIG. 4 comprises vacuum chamber 13 defined by a cylindrical housing member 15 and upper and lower plate members 17 and 19. Housing member 15 fits within annular grooves 21 and 23 in upper and lower plate members 17 and 19, respectively, to effect vacuum seals to pressures, for example, in the order of $10^{-6}$ Torr. A vacuum pump 25 of conventional design communicates with the interior of the vacuum chamber 13 along exhaust port 27 through lower plate member 19.

A substrate holder 29 is positioned along the upper portion of vacuum chamber 13 and supports substrate 9 (see FIG. 1). Substrate holder 29 is mounted for pivotal rotation on journal 31 which extends through the far wall of cylindrical member 17 and is connected to a control knob 33. Substrate holder 29, when supported in position A as shown, rests on a stop rod 35 and is disposed immediately above a clustered group of evaporation sources 37, 39, and 41. Evaporation sources 37, 39, and 41 can be of conventional design and contain selected evaporation materials for forming the laminate structure of FIG. 1. For example, if the laminate structure defines a cryotron device having a gate conductor (thin film 3) formed of soft superconductive material, e.g., tin, and a control conductor (thin film 1) formed of hard superconductive material, e.g., lead tin and lead evaporant material are contained in sources 37 and 39, respectively. On the other hand, if the laminate structure defines a crossover connection, as illustrated, wherein metallic films 1 and 3 are formed of a same material, e.g., silver, only a single evaporation source need be provided. The third evaporation source 41 contains a polymerizable organic material, for example, silicone oil, bisphenol A-epichlorohydrin, resorcinol diglycidyl ether, methyl phenyl siloxane, etc., having a low vapor pressure and which will deposit when volatilized as a thin layer on substrate 9. Sources 37, 39, and 41 are connected to temperature regulators 42, respectively, of conventional type which control electrical energy supplied thereto.

Also, while supported in position A, the entire surface of substrate 9 is exposed to an addressable electron beam from the electron gun 43. Electron gun 43 includes a deflection system, either electromagnetic or electrostatic, comprising deflection plates 45 and 47 supported in operative arrangement on a stand-off 48. Deflection plates 45 and 47 are connected to addressor unit 49 which is suitably programmed, e.g., by stored program, magnetic tape, etc., to supply appropriate signals to impinge the electron beam upon selected areas of substrate 9 in pattern fashion. As hereinafter described, when a layer of organic material has been deposited on substrate 9, the electron beam is addressed by addressor unit 49 to bombard selected areas of each such layer in desired pattern. The bombarded molecules of organic material are elevated to an excited state and polymerize, reacted portions exhibiting a sticking coefficient $\phi_1$ larger than that exhibited by unreacted portions. Accordingly, the reacted, or polymerized, portions of each such layer exhibit a greater number of nucleation sites to which subsequently-deposited metallic depositant preferentially adheres. Reacted portions of the layers 5 and 7, therefore, define the resulting depositant pattern and duplicate the function of physical pattern-defining masks in prior art processes.

Alternatively, when substrate holder 27 is rotated to position B (shown in dashed outline), substrate 9 is positioned beneath an optical system 51 for effecting a photolytic polymerization process. Optical system 51 includes a source 53 of ultraviolet light of controlled frequencies, a collimating lens 55, and an optical mask 57 whereby substrate 9 is illuminated in predetermined optical patterns. The optical pattern defined by optical mask 57 is directed along a quartz housing 59 which extends through upper plate member 17 and into the chamber 13. When the optical pattern of selected frequency is projected onto an adsorbed layer of monomeric material formed on substrate 9, photolytic polymerization of the illuminated areas is effected.

The photolytic process, as described, is similar to that described in the above-identified P. White patent. Monomeric material in gaseous form and susceptible to photolytic polymerization is first introduced into chamber 13 along input port 59. The monomeric material, e.g., butyl methacrylate, vinyl acetate, methyl methacrylate, etc., distributes itself between the vapor phase and adsorbed layers on the internal surfaces of the vacuum chamber, e.g., the surface of substrate 9. To accelerate the formation of such adsorbed layer, substrate 9 can be maintained at reduced temperatures by means of cooling coil 61. When illuminated by the optical pattern of selected frequencies, molecules of the monomeric material are raised to an excited energy state and react by a process of vinyl-addition polymerization to form a continuous polymeric film pattern. The photolytic polymerization technique differs slightly from the electron beam technique in that the nucleation image is defined by a difference in structure rather than by the polymerization of selected portions of the polymeric film. For example, unpolymerization material adsorbed on the surface of substrate 9 would evaporate when system pressures are decreased and substrate temperature is increased during the vapor deposition of the metallic depositant. In accodance with the photolytic technique, optical mask 57 is removed and the entire adsorbed layer of monomeric material is initially polymerized by illumination with ultraviolet light of given frequency by optical system 51. The desired nucleation pattern is then formed by subjecting the polymeric film to a light pattern defined by mask 57 and of ultraviolet light of higher frequency. Illumination by ultraviolet light of higher frequency is effective to alter the structure of selected portions of the polymeric layer. Due to this difference in structure, illuminated portions of the polymeric film exhibit a higher sticking coefficient with respect to a metallic depositant. It is believed that illumination by ultraviolet light of higher frequency varies the degree of crosslinking in the illuminated portions of the polymeric film and, thereby, increase the sticking coefficient with respect to the metallic depositant. For example, an adsorbed layer of vinyl acetate when illuminated by high-pressure mercury-argon arc light polymerizes and exhibits a relatively low sticking coefficient $\phi_2$ to metallic depositants; conversely, when medium-pressure mercury arc light is used, the resultant polymeric film exhibits a larger sticking coefficient $\phi_1$. It is evident that the nucleation pattern can be photolytically formed by irradiating, as described, either successively-formed adsorbed layers or a same adsorbed layer of monomeric material by light patterns of different frequencies. It is, of course, evident that a negative nucleation image can be formed by slight variation in the photolytic technique, as described. For example, when the adsorbed layer of organic material is illuminated only by an optical pattern of given frequencies from optical system 51, unreacted portions of such layer can be desorbed by reducing pressure within chamber 13 by means of vacuum pump 25 so as to expose the surface of a previously-reacted polymeric film exhibiting a higher sticking coefficient $\phi_1$. Accordingly, a controlled quantity of metallic depositant will preferably adhere to and form a continuous film only over the surface exhibiting the higher sticking coefficient.

The hereinabove-described processes produce nucleation images which are congruent with the conductive patterns to be formed. It is generic to such processes that the layer of organic material, either vapor deposited or adsorbed, is treated by the energy medium, i.e., electron beam bombardment, ultraviolet radiation, etc., in pattern fashion to form a nucleating image characterized by a high sticking coefficient. In addition, portions of the polymeric film defining the nucleation image provide electrical insulation between the metallic film pattern to be deposited and a previously deposited metallic film pattern. When the sticking coefficients of the nucleating image thus formed and remaining portions of the polymeric film are significantly different, the criticality in controlling the amount of metallic depositant is reduced. The qauntity of metallic depositant directed toward substrate 9 and over the layer of organic material should be at least sufficient to form a continuous metallic film over those portions which have been treated by the energy medium to define the nucleating image. Although some metallic depositant may adhere to the untreated portions of the layer of organic material, the quantity of metallic depositant should be insufficient to form a continuous film thereover.

The deposition sequence for forming the laminate structure of FIG. 1 is illustrated in FIGS. 2A through 2F. Initially, vacuum chamber 13 is evacuated by vacuum pump 25 to a pressure, for example, $10^{-6}$ Torr., sufficient to effect the deposition processes. Assuming that electron beam polymerization techniques are employed, substrate holder 29 is rotated to position A. Appropriate temperature regulator 42 is operated to elevate the temperature of source 41 at least in excess of the vaporization temperature of the organic material, e.g., bisphenol epichlorohydrin adduct, contained therein. The volatilized organic material passes upwardly and deposits as a thin layer 61 over the entire surface of substrate 9, as shown in FIG. 2A; layer 61 is sufficiently thin, e.g., 500 A. to insure that the entire thickness is polymerized by electron beam techniques. Electron gun 43 is then programmed by addressor unit 49 to bombard so as to polymerize selected portions of layer 61, as indicated by speckled hatching, so as to define the nucleation image of metallic film 3.

Figure 3A:
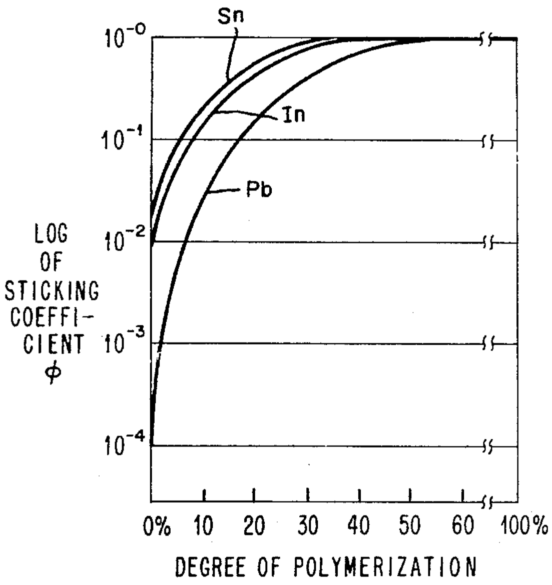
FIG. 3A shows idealized plots of the logarithm of the sticking coefficient on a particular organic material with respect to lead, tin, and indium, respectively, versus degree of polymerization.

The change in the surface conditions of the selected polymerized portions as against the uncured portions of layer 61 can be appreciated by reference to FIG. 3A wherein the sticking coefficient of polymerized bisphenol A-epichlorohydrin adduct with respect to lead, tin, and indium is plotted as a logarithmic function of the degree of polymerization; the degree of polymerization is dependent on both the intensity and the duration of the electron beam bombardment. While the curves of FIG. 3 are idealized, a similar family of curves exists for each polymeric material. As shown in FIG. 3A, the sticking coefficient $\phi$ initially increases very rapidly as the degree of polymerization of layer 61 increases and then levels off and remains substantially constant. It is preferred that the degree of polymerization be selected so as to maximize the difference in sticking coefficients of selected and unselected portions, respectively, of layer 61.

Figure 3B:
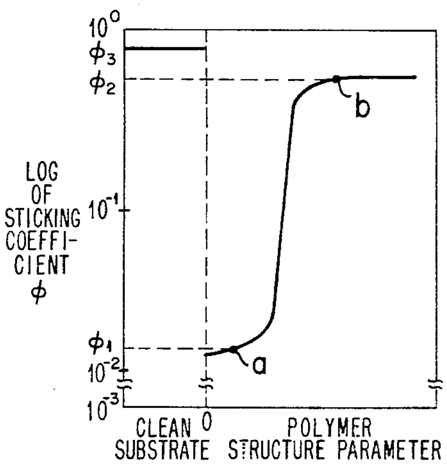
FIG. 3B shows an idealized plot of the logarithm of the sticking coefficient versus the structure of a polymerized organic thin film.

Alternatively, to form the desired nucleation image by photolytic processes, substrate 9 is rotated to position B and a monomeric material, e.g., vinyl acetate, susceptible to photolytic polymerization is introduced in a gaseous form into vacuum chamber 13; cooling coil 63 is operated to reduce the temperature of substrate 9 and accelerate the adsorption processes. In photolytic processes, it is preferred that the entire adsorbed layer 61 of monomeric material be polymerized to some degree to prevent desorption of unreacted portions which do not define the nucleation image. For example, as shown in FIG. 3B for an idealized situation, substrate 9, or a previously-deposited metallic or dielectric film may exhibit a sticking coefficient $\phi$ substantially equal to that of the final nucleation image. Accordingly, the requisite control of the depositant material greatly complicates the deposition process. To define a pronounced nucleation image, therefore, optical mask 57 is removed and the entire surface of the adsorbed layer 61 of monomeric material is illuminated by optical system 51 with ultraviolet light of selected frequencies. Accordingly, the entire adsorbed layer 61 of FIG. 2A is polymerized to exhibit a structure indicated at *a* in FIG. 3B having a sticking coefficient $\phi_2$. At this time, no nucleation image is formed in layer 61 and metallic depositant would adhere over the entire surface thereof. To form a nucleation image, optical mask 57 is positioned in optical system 51 and the frequency of light source 53 is increased whereby a light pattern of higher energy is directed onto layer 61. The light pattern of higher energy further alters the structure of selected areas of layer 61 to point *b* in FIG. 3B so as to exhibit a larger sticking coefficient $\phi_2$ (indicated by speckled hatching in FIG. 2A). The resulting change in structure of selected areas of layer 61, therefore, forms a nucleation image for a conductive film pattern, e.g., film 3 of FIG. 2B.

Conductive film 3 of FIG. 2B is formed by returning substrate holder 29 to position A and energizing source 37 by the appropriate temperature regulator 42. While metallic evaporant, e.g., tin, is directed over the entire surface of layer 61, such evaporant adheres only to the treated portions and tends to re-evaporate from the untreated portions of layer 61, as hereinabove described. When conductive film 3 has been formed, the entire surface of the layer 61 is again exposed to the energy medium to fully polymerize unselected portions of film 61, as shown in FIG. 2C. At the completion of step 2C, therefore, the partially formed laminate comprises the fully polymerized layer 61 (layer 7 of FIG. 1) formed over the entire surface of substrate 9 and conductive film 3 formed in desired pattern. If desired, an additional polymeric layer 61', indicated in dashed outline, can be deposited by the described process to insure electrical insulation between metallic strata in the laminate structure.

To form conductive film 5 of FIG. 1, the steps of FIGS. 2A, 2B, and 2C are substantially repeated in FIGS. 2D, 2E, and 2F, respectively. For example, in FIG. 2D a second layer 63 of polymerizable material is formed in the described manner over the showing of FIG. 2C and the energy medium, i.e., electron gun 43 or optical system 51, is operated to react selected portions thereof to define a nucleation image for conductive film 1 as indicated by speckled hatching. When the nucleation image has been formed in layer 63, substrate holder 29 is returned to position A and a particular evaporation source, either 37 or 39, is energized to volatilize a metallic evaporant, e.g., tin or lead, respectively. The vaporized evaporant is directed upwardly and, as shown in FIG. 2E, adheres only to reacted portions of layer 63 to form conductive film 1. Subsequently, and as illustrated in FIG. 2F, unreacted portions of layer 63 are then treated to complete the fabrication process.

It should be obvious that the described process can be also utilized to deposit thin film patterns of chemical compounds, for example, lead sulfide (PbS), cadmium sulfide (CdS), etc. In such process, the particular compound may dissociate so as to evaporate as distinct atomic species, or it may evaporate as a molecular species. For example, cadmium sulfide (CdS) evaporated from an evaporation source of the type as illustrated dissociates in accordance with the reaction $2CdS \rightarrow 2Cd + S_2$. The cadmium atoms Cd are directed upwardly and preferentially deposit onto the nucleation image formed in the manner hereinabove described. The selectively treated portions of the polymeric film 61 exhibit a higher sticking coefficient $\phi_2$ with respect to the cadmium atoms Cd than does the unreacted portions. Since the cadmium atoms Cd are chemically unsaturated, they recombine when deposited on polymeric layer 61 with free sulphur in the system to form the compound CdS in accordance with the reaction $2Cd + S_2 \rightarrow 2CdS$. The process, as described, is effective with chemical compounds which evaporate as atomic species, the layer 61 when treated being selected to exhibit a higher sticking coefficient with respect to the metallic constituent (compare FIG. 3B).

Also, while the formation of a positive image has been described, i.e., depositant material adheres only to selectively treated portion of layer 61, it is evident that a negative pattern can likewise be formed when the energy medium is effective to reduce the sticking coefficient of selected portions of an exposed surface with respect to the metallic depositant. Referring to FIG. 3B, assume a previously-deposited polymeric film exhibits a structure indicated at *b* having a high sticking coefficient $\phi_3$ and only selected portions of the adsorbed layer 61 of monomeric material formed thereover have been illuminated by optical system 51 so as to exhibit a structure indicated at *a* having a sticking coefficient $\phi_1(\phi_1 < \phi_3)$. By reducing pressures within chamber 13 by means of vacuum pump 25, unreacted portions of layer 61 are desorbed whereby the nucleation image is defined by the exposed surface of the previously-deposited polymeric film. Accordingly, metallic depositant adheres preferentially to the exposed surface of the previously-deposited polymeric film and the resulting pattern is a negative of that contained in optical mask 57.

While the invention has been particularly shown and described with reference to preferred embodiments thereof, it will be understood by those skilled in the art that various changes in form and details may be made therein without departing from the spirit and scope of the invention.

What is claimed is:

1. A method for forming a thin film pattern comprising the steps of depositing a thin layer of polymerizable material over a supporting substrate, polymerizing selected portions of said thin layer corresponding to a desired pattern to form a nucleation image exhibiting a larger sticking coefficient than do unpolymerized portions thereof, directing a controlled quantity of depositant material over the surface of said thin layer to form a continuous film over said selected polymerized portions, and removing unpolymerized portions of said thin layer from said supporting substrate.

2. The method as defined in claim 1 wherein said depositant material is a metal.

3. The method as defined in claim 1 wherein said depositant material is a semiconductor.

4. A method for forming a precise geometric pattern of material comprising the steps for forming a thin layer of polymerizable material onto a rigid substrate, exposing said thin layer to an energy medium in pattern fashion so as to polymerize selected portions thereof corresponding to said geometric pattern, said selected portions forming a nucleation image, depositing a controlled quantity of evaporant material over said thin layer whereby said evaporant material adheres only to polymerized portions of said thin layer, and exposing unpolymerized portions of said thin layer to said energy medium whereby said thin layer is fully polymerized.

5. The method as defined in claim 4 wherein said energy medium is defined as an electron beam and including the further steps of vapor depositing said polymerizable material to form said thin layer onto said substrate and directing said electron beam to impinge upon said selected portions of said thin film to effect polymerization thereof.

6. The method as defined in claim 4 including the further steps of causing said polymerizable material to form as an adsorbed layer onto said substrate, and illuminating said selected portions of said adsorbed layer with light of predetermined frequency to effect photolytic polymerization thereof.

7. A method for forming superimposed thin conductive films each in precise geometric patterns comprising the steps of forming a first thin conductive film in precise geometric pattern upon a supporting substrate, forming a thin polymerizable layer over said supporting substrate and said first conductive pattern, exposing said thin layer to an energy medium, said energy medium being operative to polymerize selected portions of said thin layer corresponding to a desired geometric pattern, polymerized portions of such thin layer exhibiting a higher sticking coefficient than do untreated portions of said thin layer, and evaporating a controlled quantity of evaporant material to form a second thin conductive film only over said selected areas, polymerized portions of said thin layer providing electrical insulation between said first and said second thin conductive films.

8. The method as defined in claim 7 including the further step of exposing said untreated portions of said thin layer to said energy medium whereby said thin layer is completely polymerized.

9. The method as defined in claim 7 wherein said energy medium is effective to completely polymerize said selected portions of said thin layer.

10. A method for forming a thin film pattern comprising the steps of forming a first thin ploymeric layer exhibiting a first sticking coefficient with respect to a selected evaporant material over a rigid substrate, forming a second thin polymeric layer exhibiting a second sticking coefficient with respect to said selected evaporant material over selected portions of said first polymeric layer, portions of the surface to be exposed to said selected evaporant material being defined by said first polymeric layer and said second polymeric layer, and depositing a controlled quantity of said selected evaporant material over said exposed surface.

11. A method for forming a thin film in precise geometric pattern comprising the steps of forming a first thin polymeric layer exhibiting a first sticking coefficient with respect to a selected evaporant material over a rigid substrate, forming a second layer of polymerizable material over said first layer, polymerizing selected portions of said second layer-corresponding to said precise geometric pattern, removing unpolymerized portions of said second layer whereby the exposed surface is defined by polymerized portions of said first layer and of said second layer, polymerized portions of said first and said second layers exhibiting different sticking coefficients with respect to a selected evaporant material, and depositing a controlled quantity of said selected evaporant material over said exposed surface.

12. A method for forming superimposed conductive thin film patterns each of precise geometric patterns comprising the steps of forming a first thin polymerizable layer over a rigid substrate located in a low pressure chamber, polymerizing selected portions of said first layer corresponding to a first geometric pattern, said selected portions of said first layer exhibiting a higher sticking coefficient with respect to an evaporant material than do remaining portions of said first layer, depositing a controlled quantity of evaporant material to form a first thin conductive pattern over polymerized portions of said first layer, polymerizing remaining portions of said first layer, forming a second thin polymerizable layer over said first layer and said first conductive pattern, polymerizing selected portions of said second layer corresponding to a second geometric pattern, said selected portions of said second layer exhibiting a higher sticking coefficient with respect to an evaporant material than do remaining portions of said second layer, vapor depositing a controlled quantity of evaporant material to form a second thin conductive pattern over polymerized portions of said second layer, polymerized portions of said second layer effectively electrically isolating said first and said second thin conductive pattern, and polymerizing remaining portions of said second layer.

13. The method as defined in claim 12 including the further steps of forming said first and said second layer, in turn, as adsorbed layers of polymerizable material, photolytically polymerizing said first and said second layers, in turn, with light of a first predetermined frequency, and illuminating said selected portions of said first and said second layers, in turn, with an optical pattern of second predetermined frequency, said second predetermined frequency being greater than said first predetermined frequency.

14. A method for forming superimposed patterns of continuous films on a rigid substrate located in a low pressure chamber comprising the steps of vapor depositing a first thin layer of polymerizable material onto said substrate, directing an electron beam to impinge upon and polymerize portions of said first thin layer corresponding to a first desired pattern, polymerized portions of said first thin layer exhibiting a larger sticking coefficient than untreated portions thereof, vapor depositing a controlled quantity of evaporant material over said first thin layer to form a first continuous film over polymerized portions thereof, directing said electron beam to impinge upon and polymerize remaining portions of said first thin layer whereby said first thin layer is polymerized, vapor depositing a second thin layer of polymerizable material over said first layer and said first continuous film, directing said electron beam to impinge upon and polymerize portions of said second thin layer corresponding to a second desired pattern, polymerized portions of said second thin layer, exhibiting a larger sticking coefficient than untreated portions thereof, and vapor depositing a controlled quantity of evaporant material over said second thin layer to form a second continuous film over polymerized portions thereof, said evaporant materials being metals and polymerized portions of said second thin layer providing electrical insulation between superimposed portions of said first and said second continuous films.

15. The method as defined in claim 14 including the further step of forming an additional polymeric layer over said first continuous film and before the step of vapor depositing said second thin layer.

16. The method as defined in claim 14 wherein said evaporant materials are selected from the group consisting of tin, lead, and silver.

17. The method as defined in claim 14 wherein said polymerizable materials are selected from the group consisting of silicone oil, bisphenol A-epichlorohydrin, resorcinol diglycidyl ether, and methyl phenyl siloxane.

18. A method for forming a continuous film in precise geometric pattern comprising the steps of locating a rigid substrate in a low pressure chamber, introducing into said chamber a predetermined partial pressure of monomeric material capable of forming an adsorbed layer upon said substrate, photolytically polymerizing said adsorbed layer in selected geometric pattern to define a nucleation image, and evaporating a controlled quantity of evaporant material over said substrate so as to form a continuous film over polymerized portions of said adsorbed layer defining said nucleation image.

19. The method as defined in claim 18 wherein said monomeric material is selected from the group consisting of butyl methacrylate, vinyl acetate, and methyl methacrylate.

20. The method as defined in claim 18 wherein the photolytic polymerization of said adsorbed layer includes the steps of exposing said adsorbed layer to actinic light of first frequency and exposing said adsorbed layer to a pattern of actinic light of second frequency corresponding to said selected geometric pattern, said second frequency being greater than said first frequency.

21. A method for forming a continuous film in precise geometric pattern comprising the steps of locating a rigid substrate in a low pressure chamber, introducing into said chamber a predetermined partial pressure of monomeric material capable of forming an adsorbed layer upon said substrate, photolytically polymerizing selected portions of said adsorbed layer, reducing pressure within said chamber to desorb remaining portions of said adsorbed layer from said substrate, and evaporating a controlled quantity of evaporant material over said substrate including polymerized portions of said adsorbed layer, said substrate and said polymerized portions of said adsorbed layer exhibiting different sticking coefficients with respect to said evaporant material.

22. A method for forming a thin film pattern comprising the steps of locating a substrate within a low pressure chamber, introducing into said chamber a controlled partial pressure of monomeric material capable of being photolytically polymerized, said monomeric material forming a first adsorbed layer over said substrate, photolytically polymerizing said first layer by actinic light of first frequency to exhibit a first sticking coefficient, maintaining said partial pressure within said chamber to form a second adsorbed layer over said first polymerized layer, photolytically polymerizing selected portions of said second layer by actinic light of second ferquency to exhibit a second sticking coefficient, reducing pressure within said chamber to adsorb unreacted portions of said second layer whereby the surface exposed to evaporant material is comprised of said first and said second layers, and vapor depositing a controlled quantity of evaporant material over said exposed surface.

23. The method as defined in claim 22 wherein polymerized portions of said second layer exhibit a larger sticking coefficient than do polymerized portions of said first layer, and including the further step of controlling the quantity of evaporant material to form a continuous pattern only over polymerized portions of said second layer.

24. The method as defined in claim 22 wherein polymerized portions of said second layer exhibit a lower sticking coefficient than do polymerized portions of said first layer, and including the further step of controlling the quantity of evaporant material to form a continuous pattern only over polymerized portions of said first layer.

25. A method for forming superimposed thin film conductive patterns comprising the steps of forming a first thin conductive pattern onto a rigid supporting substrate, depositing a thin layer of polymerizable material over said substrate and said first conductive pattern, directing an electron beam over selected portions of said thin layer whereby said selected portions are polymerized to form a nucleation image exhibiting a higher sticking coefficient with respect to a selected metallic evaporant than do remaining poritons of said thin layer, depositing a controlled quantity of said selected evaporant to form a second thin conductive pattern over said nucleation image, polymerized portions of said thin layer forming a dielectric layer between superimposed portions of said first and said second conductive patterns, and directing said electron beam over remaining portions of said thin layer whereby said entire thin layer is polymerized.

References Cited

UNITED STATES PATENTS

| | | | |
|---|---|---|---|
| 2,883,257 | 4/1959 | Wehe | 117—71 X |
| 3,271,180 | 9/1966 | White | 117—38 |

ALFRED L. LEAVITT, *Primary Examiner.*

J. H. NEWSOME, *Assistant Examiner.*